US011128266B1

(12) United States Patent
Fraser et al.

(10) Patent No.: US 11,128,266 B1
(45) Date of Patent: Sep. 21, 2021

(54) AMPLIFIERS WITH FEEDBACK CIRCUITS (71) Applicant: NXP B.V., Eindhoven (NL)

(72) Inventors: Michael Lee Fraser, Tempe, AZ (US);
Venkata Naga Koushik Malladi,
Tempe, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/942,371

(22) Filed: Jul. 29, 2020

(51) Int. Cl.
*H03F 1/42* (2006.01)
*H03F 3/24* (2006.01)
*H04B 1/44* (2006.01)
*H04W 52/52* (2009.01)

(52) U.S. Cl.
CPC ............... *H03F 1/42* (2013.01); *H03F 3/245* (2013.01); *H04B 1/44* (2013.01); *H04W 52/52* (2013.01); *H03F 2200/294* (2013.01); *H03F 2200/36* (2013.01); *H03F 2200/451* (2013.01)

(58) Field of Classification Search
CPC ...... H03F 1/42; H03F 3/245; H03F 2200/294; H03F 2200/36; H03F 2200/451; H04B 1/44; H04W 52/52
See application file for complete search history.

(56) References Cited

U.S. PATENT DOCUMENTS

| 7,956,682 | B2 * | 6/2011 | Hasegawa | ............... | H03F 1/56 |
| | | | | | 330/51 |
| 2009/0051424 | A1 * | 2/2009 | Liu | ....................... | H03F 1/3205 |
| | | | | | 330/149 |
| 2015/0207475 | A1 * | 7/2015 | Roy | ..................... | H01L 29/7787 |
| | | | | | 330/278 |
| 2020/0366256 | A1 * | 11/2020 | Pehlivanoglu | ............ | H03F 1/08 |

OTHER PUBLICATIONS

Chen, Hsien-Ku et al.; "Analysis and Design of a 1.6-28-GHz Compact Wideband LNA in 90-nm CMOS Using a π-Match Input Network"; IEEE Transactions on Microwave Theory and Techniques, vol. 58, No. 8; 13 pages (Aug. 2010).
Ladbrooke, Peter H; "MMIC design: GaAs FETs and HEMTs"; Artech House, Inc, Norwood, MA, US; Section 10.2.4 "Feedback amplifiers", Fig. 10.22; 11 pages (1989).

* cited by examiner

*Primary Examiner* — Nguyen T Vo (57) ABSTRACT

Various embodiments relate to an amplifier circuit including: a first transistor having a first and second current conducting terminals and a control terminal; a second transistor having a first and second current conducting terminals and a control terminal, in which the second current-conducting terminal of the first transistor is connected to the first current-conducting terminal of the second transistor; a first inductor with a first terminal coupled to a first current-conducting terminal of the first transistor and a second terminal coupled to an output of the amplifier circuit; a feedback circuit connected between the output and the control terminal of the second transistor, wherein the feedback circuit includes a first resistor, a second inductor, and a first capacitor; and an input of the amplifier circuit connected between the first resistor and the second inductor, wherein a second current-conducting terminal of the second transistor is connected to a first ground terminal, and wherein a control terminal of the first transistor is connected to a second ground terminal via a third capacitor.

19 Claims, 4 Drawing Sheets

AMPLIFIERS WITH FEEDBACK CIRCUITS

Various embodiments disclosed herein relate to amplifiers with feedback for flat gain while retaining stability and low noise levels.

BACKGROUND

Noise figure defines the sensitivity of a receiver making the achievement of the lowest possible noise figure of an amplifier line-up a prime objective. Gain flatness of the amplifier line-up also has system benefits by producing less distortion within the instantaneous bandwidth of the communication signal, by providing the desired dynamic range across as much usable bandwidth as possible, and by buffering the overall noise figure from degrading contributions of later stages by maintaining high gain.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

In various communication systems, for example base station transceivers in mobile phone networks, the receivers are broadband receivers. The typical amplifier topologies used in such broadband receivers tend to possess a gain roll-off as the frequency of the operating signal increases across the band. Because a flat frequency response, or as flat as possible, is desired in broadband receivers, flattening the frequency response of the receiver is desired because of various benefits. Typical receivers use multistage amplifiers. In a first stage, high gain is beneficial because it buffers noise contributions from the second and following stages which degrade overall noise figure. If the frequency response of the first stage rolls off at high frequencies, overall noise figure increases more rapidly than that of the first stage alone as frequency increases. Another aspect is the dynamic range of the receiver. Because there is typically a lot of gain in the receiver and when there is a lot of roll off at higher frequencies, a signal is received at the low end of the receive band will be greatly amplified relative to a signal received at the high end of the receive band. This signal at the low end of the receive band will jam the receiver at a lower power level than a signal incident at the high end of the band. Accordingly, it is beneficial to have a flat gain response.

The proposed feedback configurations described herein enhance gain flatness, maintaining or enhancing high frequency gain for better buffering of degradations in following stages and increasing the achievable noise figure within the amplifier stage that it is applied to. The proposed feedback configurations are much more repeatable with better performance than relying on mismatch or resistive loading.

Figure 1:
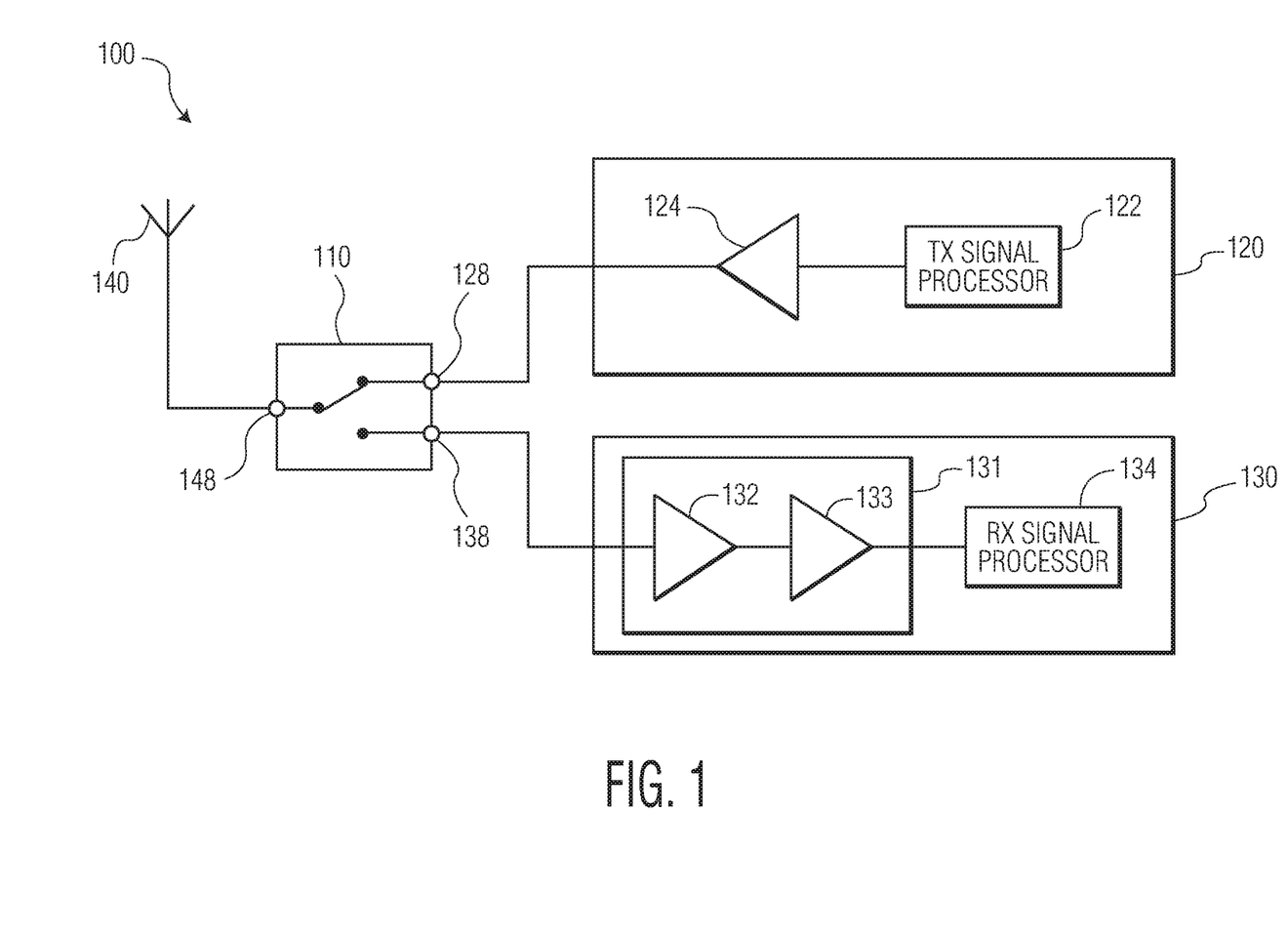
FIG. 1 is a simplified block diagram of an example of a radio frequency (RF) transceiver system.

FIG. 1 is a simplified block diagram of an example of a radio frequency (RF) transceiver system 100 that includes an RF switch 110, a transmitter 120, a receiver 130, and an antenna 140. Transceiver system 100 is a half-duplex transceiver, in which only one of the transmitter 120 or the receiver 130 are coupled, through the RF switch 110, to the antenna 140 at any given time. More specifically, the state of the RF switch 110 is controlled to alternate between coupling an RF transmit signal produced by the transmitter 120 to the antenna 140, or coupling an RF receive signal received by the antenna 140 to the receiver 130. In an alternate embodiment, the RF switch 110 may be replaced with a duplexer or circulator (e.g., circulator 260, FIG. 2).

The transmitter 120 may include, for example, a transmit (TX) signal processor 122 and a power amplifier 124. The transmit signal processor 122 is configured to produce transmit signals, and to provide the transmit signals to the power amplifier 124. The power amplifier 124 amplifies the transmit signals, and provides the amplified transmit signals to the RF switch 110. The receiver 130 may include, for example, a receive amplifier 131 (e.g., a broadband low noise multistage amplifier) and a receive (RX) signal processor 134. The receive amplifier 131 is broadband and is configured to amplify relatively low power received signals from the RF switch 110, and to provide the amplified received signals to the receive signal processor 134. The receive amplifier 131 may include a first amplifier stage 132 and a second amplifier stage 133. Additional stages may be included as well but are not shown. The receive signal processor 134 is configured to consume or process the receive signals.

During each transmit time interval, the RF switch 110 is controlled to be in a first or "transmit" state, as depicted in FIG. 1, in which a transmit signal path is closed between transmitter node 128 and antenna node 148, and in which a receive signal path is open between antenna node 148 and receiver node 138. Conversely, during each receive time interval, the RF switch 110 is controlled to be in a second or "receive" state, in which the receive signal path is closed between antenna node 148 and receiver node 138, and in which the transmit signal path is open between transmitter node 128 and antenna node 148.

The RF transceiver system 100 may be physically implemented using a variety of active and passive electrical devices, which may be housed on one or more printed circuit boards (PCBs) and/or other substrates. To facilitate assembly of such a system, various components of the RF transceiver system 100 may be implemented in self-contained modules or electrical devices, which may be coupled to a PCB that electrically connects the module/devices to other portions of the RF transceiver system 100. As used herein, the term "module" means a set of active and/or passive electrical devices (e.g., ICs and components) that are physically contained within a single housing (e.g., the device(s) are included on a common substrate referred to herein as a "module substrate") or within a single package. A "module" also includes a plurality of conductive terminals for electrically connecting the set of devices to external circuitry that forms other portions of an electrical system. Essentially, the module substrate configuration, the method of coupling the device(s) to the module's terminals, and the number of devices within the module defines the module type. For example, in various embodiments, a module may be in the form of a PCB-mounted system, a surface mount device, a chip carrier device, a ball, pin, or land grid array device, a flat package (e.g., a quad or dual flat package) device, a chip scale packaged device, a system-in-package (SiP) device, or in the form of some other type of integrated circuit package. Although a particular type of module is described below, it is to be understood that embodiments of the inventive subject matter may be included in other types of modules, as well.

Figure 2:
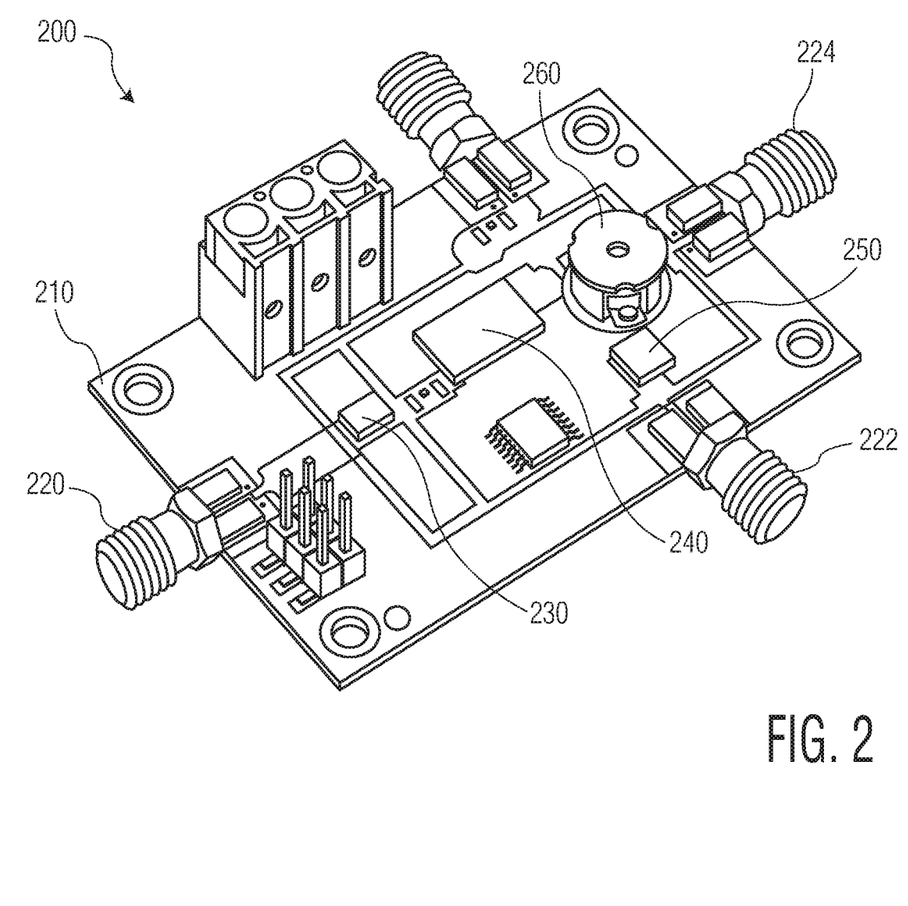
FIG. 2 is a perspective view of a transceiver module, in accordance with an example embodiment.

FIG. 2 is a perspective view of a transceiver module 200, in accordance with an example embodiment. This transceiver module may be an implementation of the transceiver of FIG. 1. Essentially, the transceiver module 200 houses a transmitter lineup and a receiver lineup. The components of transceiver module 200 are mounted on (or coupled to) a system substrate 210, which may be, for example, a multi-layer PCB or other type of substrate.

The transmitter lineup includes an RF transmit (TX) input connector 220, a pre-amplifier device 230, a power amplifier device 240, a duplexer 260 (e.g., a circulator, in the illustrated embodiment), and an RF transmit-out/receive-in (TX out/RX in) connector 224 coupled in series. The RF transmit input connector 220 is configured to be coupled to an external RF signal source, such as a transmit processor (e.g., transmit signal processor 122 in FIG. 1), which produces an analog, modulated RF transmit signal that is to be amplified and transmitted to a remote receiver. The RF transmit input connector 220 receives the RF transmit signal from the RF signal source, and conveys the signal to a first substrate transmission line between the RF transmit input connector 220 and the pre-amplifier device 230. The pre-amplifier device 230 functions as a first amplification stage, which applies a first gain to the RF transmit signal. The pre-amplified RF transmit signal is then conveyed through a second substrate transmission line between the pre-amplifier device 230 and the power amplifier device 240.

For example, the power amplifier device 240 may be a Doherty amplifier module, although the power amplifier device 240 alternatively may include a single-path amplifier, or another type of amplifier. In any event, the power amplifier device 240 includes at least one amplifier.

The power amplifier device 240 functions as a final amplification stage, which applies additional gain to the RF transmit signal, and the amplified RF transmit signal is then conveyed through a third substrate transmission line between the power amplifier device 240 and the duplexer 260. The duplexer 260 is used to isolate the transmitter and receiver. In various embodiments, the duplexer 260 may include a circulator (as illustrated), an active transmit/receive switch, or another type of duplexer. In any event, the duplexer 260 conveys the amplified RF transmit signal to a fourth substrate transmission line between the duplexer 260 and the RF transmit-out/receive-in connector 224.

The RF transmit-out/receive-in connector 224 is configured to be coupled to a load, such as an antenna, which functions to communicate the amplified RF transmit signal to the remote receiver (e.g., to radiate the amplified RF transmit signal over the air interface). The RF transmit-out/receive-in connector 224 also functions to receive an RF receive signal from the load (e.g., from an antenna, and ultimately from a remote transmitter) and to convey the RF receive signal to the receiver lineup.

The receiver lineup includes the RF transmit-out/receive-in connector 224, the duplexer 260, a low noise amplifier (LNA) module 250 (e.g., the receive amplifier 131 including stages 132 and 133 from FIG. 1 that are described in more detail in FIGS. 3-6), and an RF receive (RX) output connector 222 coupled in series. Upon receiving an RF receive signal from the load (e.g., an antenna), the RF transmit-out/receive-in connector 224 conveys the RF receive signal to the duplexer 260 through the fourth substrate transmission line. The duplexer 260 then conveys the RF receive signal over a fifth substrate transmission line to the LNA module 250. The LNA module 250 amplifies the RF receive signal, and conveys the amplified RF receive signal to a sixth substrate transmission line between the LNA module 250 and the RF receive output connector 222. As described above, it is beneficial for the LNA module to have flat gain and a low noise figure. The RF receive output connector 222 is configured to be coupled to a receive processor (e.g., receive signal processor 134 in FIG. 1), which processes (e.g., demodulates, converts to digital, and otherwise processes) the RF receive signal.

In many receive amplifiers multiple stages are used (as seen in the example of FIG. 1). In a multistage amplifier, the noise figure of the first stage dominates the overall noise figure if the gains of the following stages are high. So high gain across the frequency band leads to a better overall noise figure for the receiver.

Because the noise figure of the first stage dominates the overall noise figure of the amplifier, the amount of frequency flattening that can be achieved in the first stage is less than in later stages, because the elements added to the amplifier stage to flatten the frequency response also may degrade the noise figure. In the later stages a more aggressive approach may be taken to flatten the frequency response of the amplifier because the degradation in noise figures has less of an impact on the overall noise figure, and increasing the gain further reduces these effects from later stages including the RX signal processor 134. As a result, in the later stages of the amplifier the phase of the feedback loop may actually cause an upslope in the frequency response that helps to compensate for gain roll off in the other stages.

Figure 3:
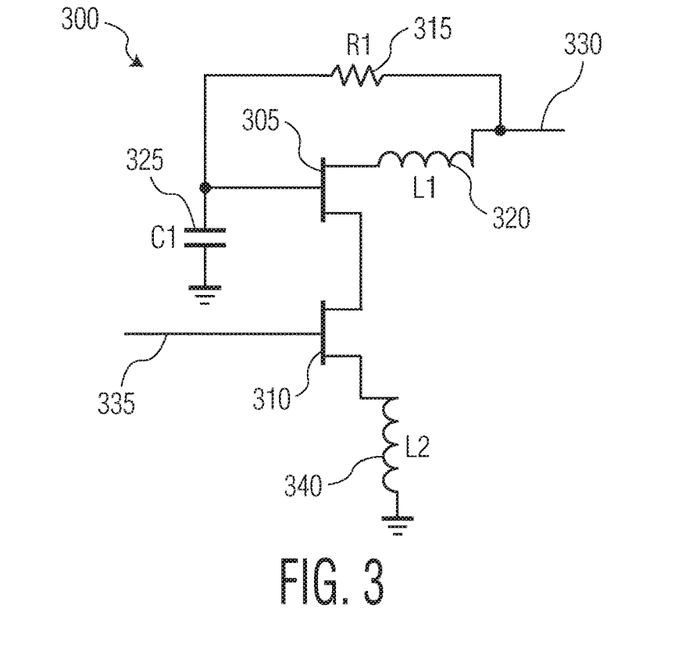
FIG. 3 illustrates an embodiment of a first stage amplifier.

FIG. 3 illustrates an embodiment of a first stage amplifier 300. The first stage amplifier 300 may be the first stage amplifier 132 as shown in FIG. 1. The amplifier 300 includes two transistors 305 and 310 in a cascode configuration. The transistors 305 and 310 are shown as field effect transistors (FET), but they may also be bipolar transistors as well. The transistors 305 and 310 may be implemented using silicon, silicon-germanium, gallium nitride, gallium arsenide or other materials used for transistors. Each of transistors 305, 310 include a gate terminal (also referred to as an input terminal and/or control terminal) and two current-conducting terminals (also referred to as source and drain terminals), with a variably-conductive channel between the two current-conducting terminals. Generally, connections to the source and drain terminals of a particular transistor are interchangeable.

The amplifier 300 has an input 335 that receives the input signal to be amplified, and the amplified signal is produced at an output 330 of the amplifier 300. The amplifier input 335 is connected to the gate of transistor 310. One of the current-conducting terminals of transistor 310 (e.g., the source of transistor 310) is connected to a first terminal of an inductor L2 340 which has a second terminal connected to a ground terminal (i.e., a terminal configured to be coupled to an external ground reference voltage). The purpose of inductor L2 340 is to transform the input impedance of the device for improved impedance match without degrading achievable noise figure. Utilizing L2 340 for its impedance matching benefits will aggravate gain roll-off with increasing frequency, however. According to an embodiment, inductor L2 340 may have an inductance value in a range of about 0 to about 2 nH although the inductance value may be lower or higher, as well. The other current-conducting terminal of transistor 310 (e.g., the drain of transistor 310) is coupled to one of the current-conducting terminals (e.g., the source) of transistor 305.

The other current-conducting terminal (e.g., the drain) of the transistor 305 is coupled to the amplifier output 330 via inductor L1 320. Signals present at the output 330 are fed back to the gate of transistor 305. The gate of transistor 305 is also connected to a first terminal of capacitor C1 325 which has a second terminal connected to a ground terminal. The purpose of capacitor C1 325 is to provide an RF ground reference for the gate of the upper device of the cascode amplifier. In this embodiment, the capacitor is not sufficiently high in value to provide a very low impedance to ground enabling the feedback effect from the output 330 to the gate of the upper device 305. According to an embodiment, capacitor 325 may have a capacitance value in a range of about 0 to 2 pF although the capacitance value may be lower or higher, as well.

The amplifier 300 uses feedback from the output 330 to control the operation of the amplifier 300. The feedback loop has a resistor R1 315 between the output 330 and the gate of transistor 305. The purpose of resistor R1 315 is to control the amount of negative feedback. According to an embodiment, resistor 315 has a resistance value in a range of about 100 to about 1000 Ohms, although the resistance value may be lower or higher, as well. Signals present at the output 330 are fed back to the gate of transistor 305 through resistor 315 in order to minimize the impact on the noise figure of the amplifier. The inductor L1 320 is also in the feedback loop. The inductor L1 320 may help to shape the frequency response of the feedback. According to an embodiment, inductor L1 320 may have an inductance value in a range of about 0.5 to 3 nH, although the inductance value may be lower or higher, as well.

Conventional feedback loops may reduce gain at higher frequencies as well as at lower frequencies where the effect is targeted. These issues can cause the frequency response of the amplifier to roll off at higher frequencies. The addition of inductor L1 320 into the feedback loop may act to attenuate the higher frequency components of the feedback, altering the feedback frequency response in a beneficial manner. The inductor L1 320 may reduce the negative feedback at higher frequencies resulting in less feedback at higher frequencies which would cancel amplifier gain. The suppression of negative feedback using the inductor L1 320 at higher frequencies may result in higher gain for better flatness and buffering of the noise figure in the following stages. It also may result in better noise figure for the first stage amplifier 300 by reducing detrimental negative feedback to the upper device gate at higher frequencies.

Figure 4:
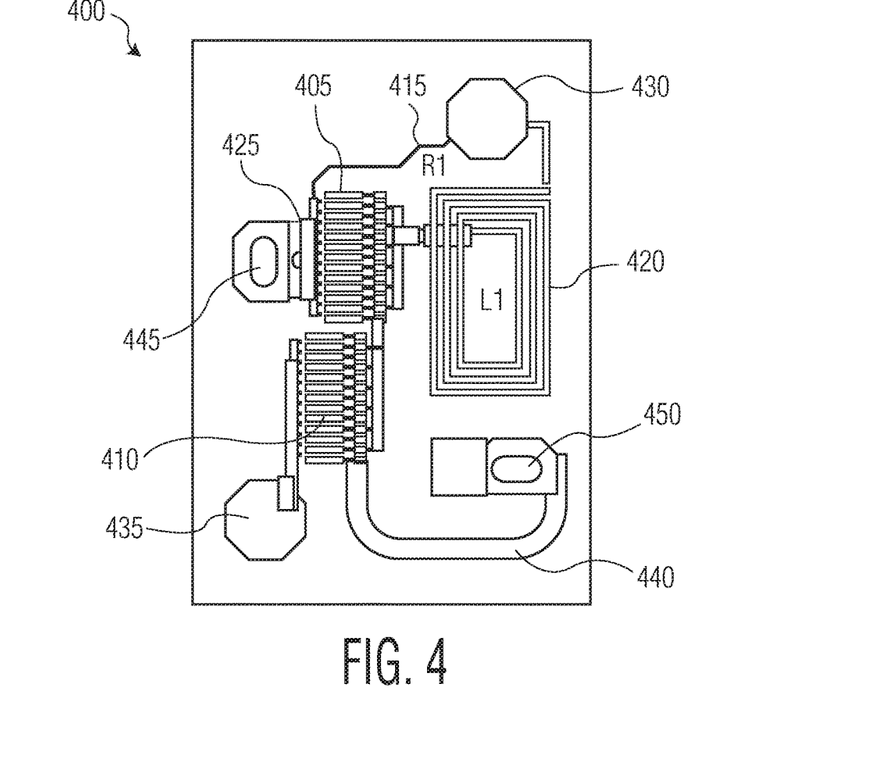
FIG. 4 illustrates the layout of an implementation of amplifier on an integrated circuit.

FIG. 4 illustrates the layout of an implementation of amplifier 300 on an integrated circuit (IC). The IC 400 is a monolithic semiconductor device, which includes contact pads 430 and 435 corresponding to the amplifier output and input (e.g., input 335 and output 330, FIG. 3), respectively. The IC includes transistors 405 and 410 corresponding to transistors 305 and 310, respectively. The inductor L1 420 is an integrated coiled inductor (e.g., formed from portions of one or more patterned conductive layers and associated interconnects) corresponding to L1 320. The length and shape of the patterned conductive layer portions results in the desired inductance value for L1 420. In alternate embodiments, the inductor 420 may be implemented using a discrete, surface mount device or one or more bondwires or coils coupled to contact pads on the top surface of the IC 400. The resistor R1 415 corresponds to resistor 315 and may be implemented using resistive semiconductor materials and/or conductive traces (e.g., portions of patterned conductive layers). In some embodiments, resistor 315 may be a laser trimmable resistor. Alternatively, the resistor 415 may be a discrete, surface mount device coupled to contact pads on the top surface of the IC 400. The capacitor 425 corresponds to the capacitor 325 and may be implemented as a parallel plate capacitor, metal-insulator-metal capacitor, a metal oxide semiconductor capacitor, or any other type of capacitor. Capacitor 425 may be integrally formed with IC 400, or may be a discrete, surface mount device coupled to contact pads on the top surface of IC 400. The inductor L2 440 corresponding to inductor 340 may be implemented using portions of one or more patterned metal layers and associated interconnects, with a first terminal connected to transistor 410, and a second terminal connected to a ground terminal 440 on the top or bottom surface of IC 400. The lengths and shapes of the patterned metal layer portions and the associated interconnects implement the desired inductance value for L2 440. Ground terminals 440 and 445 may be coupled to external ground references to provide the needed ground connections in the amplifier circuit.

Figure 5:
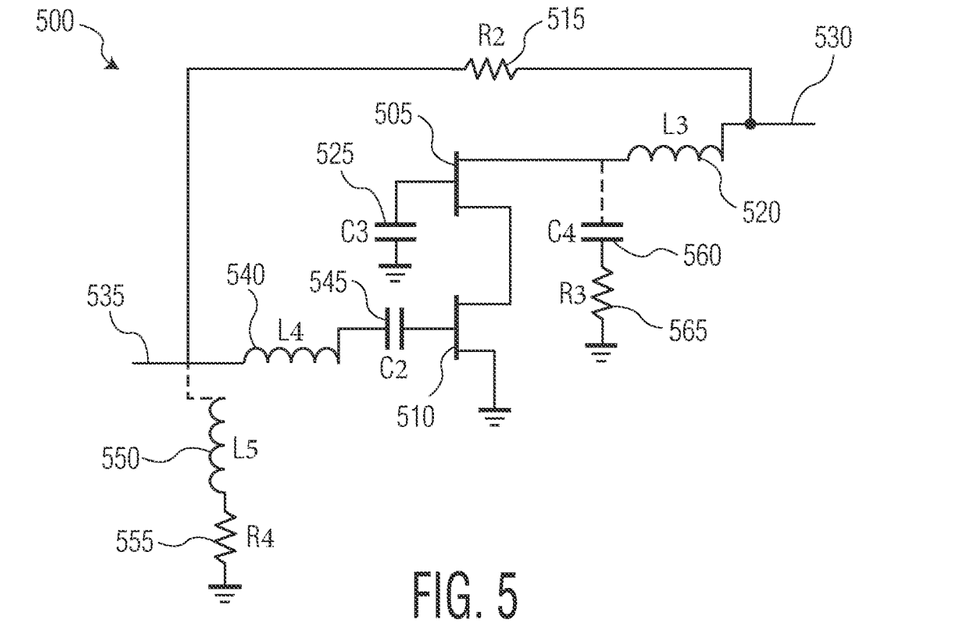
FIG. 5 illustrates an embodiment of a second or later stage amplifier.

FIG. 5 illustrates an embodiment of a second or later stage amplifier 500. The second stage amplifier 500 may be the second stage amplifier 133 as shown in FIG. 1. The amplifier 500 includes two transistors 505 and 510 in a cascode configuration. The transistors 505 and 510 are shown as field effect transistors (FET), but they may also be bipolar transistors as well. The transistors 505 and 510 may be implemented using silicon, silicon-germanium, gallium nitride, gallium arsenide or other materials used for transistors. Each of transistors 505, 510 include a gate terminal (also referred to as an input terminal and/or control terminal) and two current-conducting terminals (also referred to as source and drain terminals), with a variably-conductive channel between the two current-conducting terminals. The source terminal of transistor 505 is connected to the drain terminal of transistor 510.

The amplifier 500 has an input 535 that receives the input signal to be amplified, and the amplified signal is produced at an output 530 of the amplifier 500. The amplifier input 535 is connected to the of the control terminal (e.g., the gate) of transistor 510 through a series inductor-capacitor (LC) circuit including an inductor L4 540 and capacitor C2 545. The other current-conducting terminal (e.g., the drain) of the transistor 505 is coupled to the amplifier output 530 via inductor L3 520. The signals present at the output 530 are fed back to the gate of transistor 510 through a feedback loop circuit that includes a resistor R2 515, the inductor L4 540, and the capacitor C2 545. The feedback loop also includes inductor L3 520. The source of transistor 510 is connected to ground, and the gate of transistor 505 is connected to a capacitor C3 525 which is then connected to a ground terminal. The purpose of capacitor C3 525 is to provide a ground reference at RF frequencies for the upper device of the cascode.

According to an embodiment, inductor L3 520 may have an inductance value in a range of about 0.5 to 3 nH and inductor L4 540 may have an inductance value in a range of about 0.5 to 3 nH although the inductance values may be lower or higher as well. According to an embodiment, capacitor C2 545 may have a capacitance value in a range of about 0.5 to 10 pF and capacitor C3 525 may have a capacitance value in a range of about 0.5 to 10 pF although the capacitance values may be lower or higher as well. According to an embodiment, resistor R2 515 may have a resistance value in a range of about 100 to 5000 Ohms although the resistance value may be lower or higher as well.

The amplifier 500 uses negative feedback signals from the output to control the operation of the amplifier 500. In this case the feedback signals are applied to the gate of transistor 510, instead of 505 as was done in the amplifier 300. Applying the feedback to transistor 510 improves the gain flatness of the amplifier because the feedback has a stronger effect because of more gain in the loop, but this approach will degrade the noise figure. As the overall noise figure of the multistage receiver mostly depends upon the noise figure of the first stage amplifier when the first stage sufficiently high gain, this approach allows for a flatter gain of the amplifier 500 and the degradation in noise figure minimally effects the overall noise figure of the multistage receiver.

The feedback loop includes inductor L3 520, resistor R2 515, inductor L4 540, and capacitor C2 545. As described above the inductor L3 520 helps to reduce the effects of high frequency feedback. To further shape the frequency response of the negative feedback, the LC circuit including L4 540 and C2 545 further filters the feedback signal as the LC circuit has a resonant frequency and acts as a bandpass filter about that resonant frequency. Accordingly, the addition of L3 520, L4 540, and C2 545 to the feedback loop allows for better frequency shaping of the feedback which results in a flatter frequency gain across the bandwidth of the amplifier 500.

The addition of L3 520, L4 540, and C2 545 to the feedback loop adds additional negative phase in the feedback loop. If the phase wraps around far enough, it can lead to positive feedback with would lead to an unstable amplifier 500. In order to reduce the phase delay in the feedback loop, a series resistor-capacitor (RC) circuit including a capacitor C4 560 and resistor R3 565 may be connected between the drain of transistor 505 and the inductor L3 520. In addition, a series inductor-resistor (LR) circuit including an inductor L5 550 in series with a resistor R4 555 may be connected between the input 535 and ground. One or both of the RC and LR circuits may be added to reduce the effects of phase delay in the feedback loop which will help prevent the phase delay from wrapping around and causing instabilities in the amplifier 500.

According to an embodiment, inductor L5 550 may have an inductance value in a range of about 2 to 6 nH although the inductance value may be lower or higher as well. According to an embodiment, capacitor C4 560 may have a capacitance value in a range of about 0.1 to 1 pF, although the capacitance value may be lower or higher as well. According to an embodiment, resistor R3 565 may have a resistance value in a range of about 1 to 100 Ohm, and resistor R4 555 may have a resistance value in a range of about 0 to 20 Ohms although the resistance values may be lower or higher as well.

Figure 6:
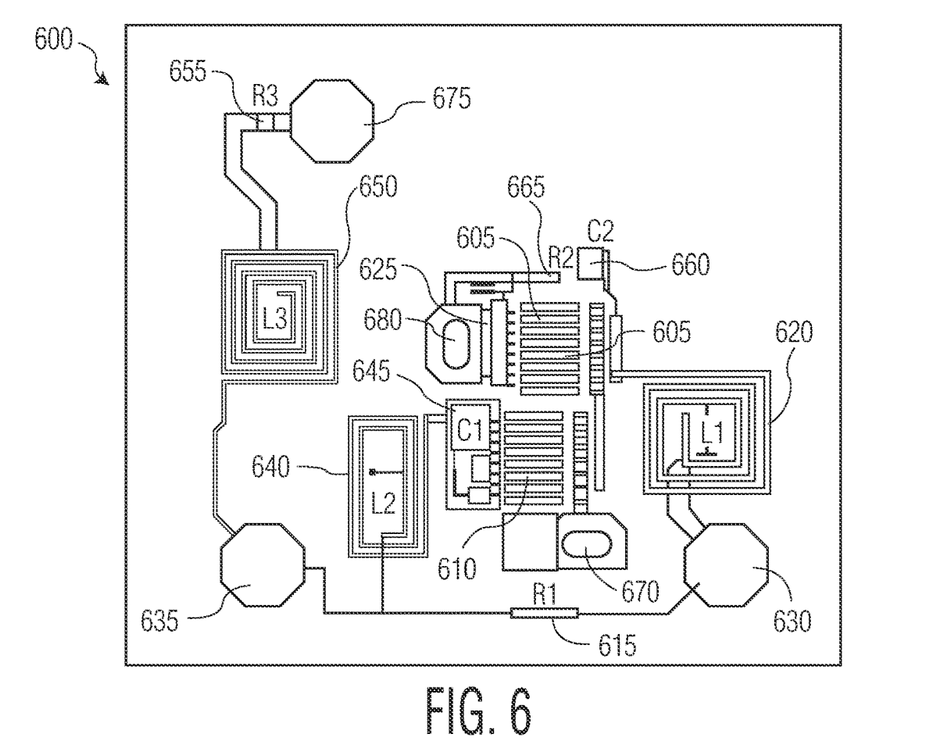
FIG. 6 illustrates the layout of an implementation of amplifier on an integrated circuit.

FIG. 6 illustrates the layout of an implementation of amplifier 500 on an IC. The IC 600 is a monolithic semiconductor device, which includes contact pads 630 and 635 corresponding to the amplifier output and input (e.g., input 535 and output 530, FIG. 5), respectively. The IC includes transistors 605 and 610 corresponding to transistors 505 and 510, respectively. The inductors L1 620, L2 640, and L3 650 are integrated coiled inductors (e.g., formed from portions of one or more patterned conductive layers and associated interconnects) corresponding to L3 520, L4 540, and L5 550, respectively. The length and shape of the patterned conductive layer portions results in the desired inductance values for L1 620, L2 640, and L3 650. In alternate embodiments, the inductors L1 620, L2 640, and L3 650 may be implemented using a discrete, surface mount device or one or more bondwires or coils coupled to contact pads on the top surface of the IC 400. The resistors R1 615, R2 665, and R3 655 correspond to resistors 515, 565, and 555, respectively and may be implemented using resistive semiconductor materials and/or conductive traces (e.g., portions of patterned conductive layers). In some embodiments, resistors 515, 565, and 555 may be laser trimmable resistors. The capacitors C1 645, C2 660, and C3 625 correspond to the capacitors 545, 560, and 525, respectively and may be implemented as a parallel plate capacitor, metal-insulator-metal capacitor, metal oxide semiconductor capacitor, or any other type of capacitor. Capacitors 645, 660, and 625 may be integrally formed with IC 600, or may be a discrete, surface mount device coupled to contact pads on the top surface of IC 600. Ground terminals 670, 675, and 680 may be coupled to external ground references to provide the needed ground connections in the amplifier circuit.

It is noted that the first stage amplifier 300 and the second stage amplifier 500 may be implemented on the same integrated circuit. Hence the embodiments of FIGS. 4 and 6 may be combined onto a single die, although they may be implemented on separate die, as well. Also, it is noted that additional amplifier stages may be included in the receive amplifier, where those stages may be substantially the same as the second stage amplifier 500.

The multistage amplifier may be implemented as a multi-chip module (MCM) where multiple ICs are used to implement the various stages of the multistage amplifier. Also, discrete elements may be used to implement the multistage amplifier that are mounted and connected on a circuit board.

The various values of the parameter values for the various resistors, inductors, and capacitors are selected based upon the specific desired frequency characteristics of the amplifier. The use of inductors and capacitors in the feedback loops may help to reduce the gain fall off at higher frequencies by reducing the feedback at higher frequencies. This may then lead to a flatter frequency response.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An amplifier circuit comprising:
   a first transistor having first and second current conducting terminals and a control terminal;
   a second transistor having a first and second current conducting terminals and a control terminal, in which the second current-conducting terminal of the first transistor is connected to the first current-conducting terminal of the second transistor;
   a first inductor with a first terminal coupled to the first current-conducting terminal of the first transistor and a second terminal coupled to an output of the amplifier circuit;
   a feedback circuit connected between the output and the control terminal of the second transistor, wherein the feedback circuit includes a first resistor, a second inductor, and a first capacitor; and
   an input of the amplifier circuit connected between the first resistor and the second inductor,
   wherein the second current-conducting terminal of the second transistor is connected to a first ground terminal, and
   wherein a control terminal of the first transistor is connected to a second ground terminal via a third capacitor.

2. The amplifier circuit of claim 1, further comprising a second capacitor connected to the first current-conducting terminal of the first transistor and a second resistor connected between the second capacitor and a third ground terminal.

3. The amplifier circuit of claim 2, further comprising a third inductor connected to the input and a third resistor connected between the third inductor and a fourth ground terminal.

4. The amplifier circuit of claim 1, further comprising a third inductor connected to the input and a third resistor connected between the third inductor and a fourth ground terminal.

5. An amplifier circuit comprising:
   a first amplifier stage including:
      a first stage output transistor having first and second current conducting terminals and a control terminal;
      a first stage input transistor having first and second current conducting terminals and a control terminal, in which the second current-conducting terminal of the first stage output transistor is connected to the first current-conducting terminal of the first stage input transistor;
      a first inductor with a first terminal coupled to the first current-conducting terminal of the first stage output transistor and a second terminal coupled to an output of the first amplifier stage;
      a feedback circuit connected between the output of the first amplifier stage and the control terminal of the first stage output transistor, wherein the feedback circuit includes a first resistor;
      an input of the first amplifier stage connected to the control terminal of the first stage input transistor;
      a second inductor connected between the second current-conducting terminal of the first stage input transistor and a first ground terminal; and
      a capacitor connected between the control terminal of the first stage output transistor and a second ground terminal; and
   a second amplifier stage including an input of the second amplifier stage connected to the output of the first amplifier stage, the second amplifier stage including:
      a second stage output transistor having first and second current conducting terminals and a control terminal;
      a second stage input transistor having first and second current conducting terminals and a control terminal, in which the second current-conducting terminal of the second stage output transistor is connected to the first current-conducting terminal of the second stage input transistor;
      a third inductor with a first terminal coupled to a first current-conducting terminal of the second stage output transistor and a second terminal coupled to a second output of the second amplifier circuit; and
      a feedback circuit connected between the second output and the control terminal of the second stage input transistor, wherein the feedback circuit includes a second resistor, a fourth inductor, and a second capacitor,
      wherein the second input is connected between the second resistor and the third inductor, wherein the second current-conducting terminal of the second stage input transistor is connected to a third ground terminal, and wherein the control terminal of the second stage output transistor is connected to a fourth ground terminal via a third capacitor.

6. The amplifier circuit of claim 5, wherein the second amplifier stage further comprises a fourth capacitor connected to the first current-conducting terminal of the second stage input transistor and a third resistor connected between the third capacitor and a fifth ground terminal.

7. The amplifier circuit of claim 6, wherein the second amplifier stage further comprises a fifth inductor connected to the input of the second amplifier stage and a fourth resistor connected between the fifth inductor and a sixth ground terminal.

8. The amplifier circuit of claim 5, wherein the second amplifier stage further comprises a fifth inductor connected to the input of the second amplifier stage and a fourth resistor connected between the fifth inductor and a sixth ground terminal.

9. A low noise amplifier die, comprising:
a first amplifier stage including:
a first stage output transistor having first and second current conducting terminals and a control terminal;
a first stage input transistor having first and second current conducting terminals and a control terminal, in which the second current-conducting terminal of the first stage output transistor is connected to the first current-conducting terminal of the first stage input transistor;
a first inductor with a first terminal coupled to the first current-conducting terminal of the first stage output transistor and a second terminal coupled to an output of the first amplifier stage;
a feedback circuit connected between the output of the first amplifier stage and a control terminal of the first stage output transistor, wherein the feedback circuit includes a first resistor;
an input of the first amplifier stage connected to the control terminal of the first stage input transistor;
a second inductor connected between the second current-conducting terminal of the first stage input transistor and a first ground terminal; and
a first capacitor connected between a control terminal of the first stage output transistor and a second ground terminal; and
a second amplifier stage including an input of the second amplifier stage connected to the output of the first amplifier stage, the second amplifier stage including:
a second stage output transistor having first and second current conducting terminals and a control terminal;
a second stage input transistor having a first and second current conducting terminals and a control terminal, in which the second current-conducting terminal of the second stage output transistor is connected to the first current-conducting terminal of the second stage input transistor;
a third inductor with a first terminal coupled to the first current-conducting terminal of the second stage output transistor and a second terminal coupled to an output of the second amplifier stage; and
a feedback circuit connected between the output of the second amplifier stage and the control terminal of the second stage input transistor, wherein the feedback circuit includes a second resistor, a fourth inductor, and a second capacitor, wherein the input of the second amplifier stage is connected between the second resistor and the fourth inductor, wherein the second current-conducting terminal of the second stage input transistor is connected to a third ground terminal, and wherein the control terminal of the second stage output transistor is connected to a fourth ground terminal via a third capacitor.

10. The low noise amplifier die of claim 9, wherein the second amplifier stage further comprises a fourth capacitor connected to the first current-conducting terminal of the second stage input transistor and a third resistor connected between the fourth capacitor and a fifth ground terminal.

11. The low noise amplifier die of claim 10, wherein the second amplifier stage further comprises a fifth inductor connected to the input of the second amplifier stage and a fourth resistor connected between the fifth inductor and a sixth ground terminal.

12. The low noise amplifier die of claim 9, wherein the second amplifier stage further comprises a fifth inductor connected to the input of the second amplifier stage and a fourth resistor connected between the fifth inductor and a sixth ground terminal.

13. A base station transceiver, comprising:
a receiver including a low noise amplifier that includes:
a first amplifier stage including:
a first stage output transistor having first and second current conducting terminals and a control terminal;
a first stage input transistor having first and second current conducting terminals and a control terminal, in which the second current-conducting terminal of the first stage output transistor is connected to the first current-conducting terminal of the first stage input transistor;
a first inductor with a first terminal coupled to the first current-conducting terminal of the first stage output transistor and a second terminal coupled to an output of the first amplifier stage;
a feedback circuit connected between the output of the first amplifier stage and a control terminal of the first stage output transistor, wherein the feedback circuit includes a first resistor;
an input of the first amplifier stage connected to the control terminal of the first stage input transistor;
a second inductor connected between the second current-conducting terminal of the first stage input transistor and a first ground terminal; and
a first capacitor connected between a control terminal of the first stage output transistor and a second ground terminal; and
a second amplifier stage including an input of the second amplifier stage connected to the output of the first amplifier stage, the second amplifier stage including:
a second stage output transistor having first and second current conducting terminals and a control terminal;
a second stage input transistor having a first and second current conducting terminals and a control terminal, in which the second current-conducting terminal of the second stage output transistor is connected to the first current-conducting terminal of the second stage input transistor;
a third inductor with a first terminal coupled to the first current-conducting terminal of the second stage output transistor and a second terminal coupled to an output of the second amplifier stage; and a feedback circuit connected between the output of the second amplifier stage and the control terminal of the second stage input transistor, wherein the feedback circuit includes a second resistor, a fourth inductor, and a second capacitor, wherein the input of the second amplifier stage is connected between the second resistor and the fourth inductor, wherein the second current-conducting terminal of the second stage input transistor is connected to a third ground terminal, and wherein the control terminal of the second stage output transistor is connected to a fourth ground terminal via a third capacitor.

14. The base station transceiver of claim 13, wherein the second amplifier stage further comprises a fourth capacitor connected to the first current-conducting terminal of the second stage input transistor and a third resistor connected between the fourth capacitor and a fifth ground terminal.

15. The base station transceiver of claim 14, wherein the second amplifier stage further comprises a fifth inductor connected to the second input and a fourth resistor connected between the fifth inductor and a sixth ground terminal.

16. The base station transceiver of claim 13, wherein the second amplifier stage further comprises a fifth inductor connected to the input of the second amplifier stage and a fourth resistor connected between the fifth inductor and a sixth ground terminal.

17. The base station transceiver of claim 13, wherein the receiver includes a receive signal processor.

18. The base station transceiver of claim 17, further comprising a transmitter including a transmit amplifier and a transmit signal processor.

19. The base station transceiver of claim 18, further comprising a switch configured to connect the transmitter or the receiver to an antenna.

\* \* \* \* \*